United States Patent
Lopez et al.

(10) Patent No.: US 9,721,860 B2
(45) Date of Patent: Aug. 1, 2017

(54) SILICON PACKAGE FOR EMBEDDED SEMICONDUCTOR CHIP AND POWER CONVERTER

(71) Applicant: Texas Instruments Incorporated, Dallas, TX (US)

(72) Inventors: Osvaldo Jorge Lopez, Annandale, NJ (US); Jonathan Almeria Noquil, Bethlehem, PA (US); Tom Grebs, Bethlehem, PA (US); Simon John Molloy, Allentown, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 139 days.

(21) Appl. No.: 14/534,254

(22) Filed: Nov. 6, 2014

(65) Prior Publication Data

US 2016/0133534 A1    May 12, 2016

(51) Int. Cl.
*H01L 23/13*    (2006.01)
*H01L 23/14*    (2006.01)
*H01L 21/48*    (2006.01)
*H01L 23/00*    (2006.01)

(52) U.S. Cl.
CPC .......... *H01L 23/147* (2013.01); *H01L 21/481* (2013.01); *H01L 23/13* (2013.01); *H01L 24/83* (2013.01); *H01L 2924/1306* (2013.01); *H01L 2924/1425* (2013.01)

(58) Field of Classification Search
CPC .............................. H01L 23/147; H01L 23/13
See application file for complete search history.

(56) References Cited

U.S. PATENT DOCUMENTS

| | | | |
|---|---|---|---|
| 6,867,499 B1 * | 3/2005 | Tabrizi | H01L 23/13 257/666 |
| 2007/0040254 A1 | 2/2007 | Lopez | |
| 2010/0230790 A1 | 9/2010 | Disney | |
| 2012/0256239 A1 | 10/2012 | Herbsommer et al. | |
| 2013/0087900 A1 | 4/2013 | Lopez et al. | |
| 2014/0063744 A1 | 3/2014 | Lopez et al. | |

OTHER PUBLICATIONS

Notification of Transmittal of the International Search Report and the Written Opinion of the International Searching Authority, Othe Declaration mail date: Feb. 4, 2016.

\* cited by examiner

*Primary Examiner* — Robert Bachner
*Assistant Examiner* — Molly Reida
(74) *Attorney, Agent, or Firm* — Jacqueline J. Garner; Charles A. Brill; Frank D. Cimino

(57) ABSTRACT

A packaged transistor device (100) comprises a semiconductor chip (101) including a transistor with terminals distributed on the first and the opposite second chip side; and a slab (110) of low-grade silicon (l-g-Si) configured as a ridge (111) framing a depression including a recessed central area suitable to accommodate the chip, the ridge having a first surface in a first plane and the recessed central area having a second surface in a second plane spaced from the first plane by a depth (112) at least equal to the chip thickness, the ridge covered by device terminals (120; 121) connected to attachment pads in the central area having the terminals of the first chip side attached so that the terminals (103) of the opposite second chip side are co-planar with the device terminals on the slab ridge.

9 Claims, 6 Drawing Sheets

SILICON PACKAGE FOR EMBEDDED SEMICONDUCTOR CHIP AND POWER CONVERTER

FIELD

The present invention is related in general to the field of semiconductor devices and processes, and more specifically to the structure and wafer-scale fabrication method of a low-grade silicon package for an embedded semiconductor transistor chip and an embedded power converter.

DESCRIPTION OF RELATED ART

In the majority of today's semiconductor devices, the semiconductor chip is typically assembled on a substrate such as a metallic leadframe or a multi-level laminate, and encapsulated in a package of a robust material such as ceramic or hardened plastic compound. The assembly process typically includes the process of attaching the chip to a substrate pad or the leadframe pad, and the process of connecting the chip terminals to substrate leads using bonding wires or solder balls.

The use of widely different materials such as metals, ceramics, and plastics cause challenges not only for mutual parts adhesion, but also for long-term device stability; an example is delamination of adjacent parts. For plastic-packaged semiconductor devices, extensive research has been dedicated to identify corrective measures for device reliability issues caused by thermo-mechanical stress due to material-based mismatches of the coefficients of thermal expansion; degradation due to stress effects could so far only be mitigated but not eliminated. In addition, moisture-related degradation of electrical characteristics in plastic-encapsulated devices has been well documented, but has been brought under control only to a certain degree. Much effort has further been extended to prevent the onset of fatigue and cracking in metallic connections in devices after operational temperature excursions, again only with limited success.

Among the popular families of power supply circuits are the power switching devices for converting on DC voltage to another DC voltage. Particularly suitable for the emerging power delivery requirements are the Power Blocks with two power MOS field effect transistors (FETs) connected in series and coupled together by a common switch node; such assembly is also called a half bridge. When a regulating driver and controller is added, the assembly is referred to as Power Stage or, more commonly, as Synchronous Buck Converter. In the synchronous Buck converter, the control FET chip, also called the high-side switch, is connected between the supply voltage $V_{IN}$ and the LC output filter, and the synchronous (sync) FET chip, also called the low side switch, is connected between the LC output filter and ground potential. The gates of the control FET chip and the sync FET chip are connected to a semiconductor chip including the circuitry for the driver of the converter and the controller; the chip is also connected to ground potential.

For many of today's power switching devices, the chips of the power MOSFETs and the chip of the driver and controller IC are assembled horizontally side-by-side as individual components. Each chip is typically attached to a rectangular or square-shaped pad of a metallic leadframe; the pad is surrounded by leads as output terminals. In other power switching devices, the power MOSFET chips and the driver-and-controller IC are assembled horizontally side-by-side on a single leadframe pad, which in turn is surrounded on all four sides by leads serving as device output terminals. The leads are commonly shaped without cantilever extensions, and arranged in the manner of Quad Flat No-Lead (QFN) or Small Outline No-Lead (SON) devices. The electrical connections from the chips to the leads may be provided by bonding wires, which introduce, due to their lengths and resistances, significant parasitic inductance into the power circuit. In some recently introduced advanced assemblies, clips substitute for many connecting wires. These clips are wide and introduce minimum parasitic inductance, but are more expensive than wire bonds and require a more involved assembly process. Each assembly is typically packaged in a plastic encapsulation, and the packaged components are employed as discrete building blocks for board assembly of power supply systems.

In other recently introduced schemes, the control FET chip and the sync FET chip are assembled vertically on top of each other as a stack, with the physically larger-area chip of the two attached to the leadframe pad, and with clips providing the connections to the switch node and the stack top. Independent of the physical size, the sync FET chip needs a larger active area than the active area of the control FET chip, due to considerations of duty cycle and conduction loss. When both the sync chip and the control chip are assembled source-down, the larger (both physically and active area) sync chip is assembled onto the leadframe pad and the smaller (both physically and active area) control chip has its source tied to the drain of the sync chip, forming the switch node, and its drain to the input supply $V_{IN}$; a clip is connected to the switch node between the two chips. The pad is at ground potential and serves as a spreader of operationally generated heat; the elongated clip of the stack top is tied to input supply $V_{IN}$.

SUMMARY

Applicants realized that a radically new approach was needed in order to significantly improve semiconductor transistor devices, power blocks and power converters with respect to reducing parasitic resistances and inductances, improving thermal performances and speed, enhancing operational reliability in moist and temperature-variable ambient, and reducing manufacturing cost. The conventional composite package, where semiconductor chips are assembled on a metallic carrier and packaged in a plastic encapsulation, combines materials of widely different coefficients of thermal expansion, leading to a propensity for thermo-mechanical stresses, and requires a lengthy, time-consuming and costly fabrication flow.

Applicants solved the materials and cost problems of a semiconductor package, when they discovered a structure concept and manufacturing flow for packages, which adopts and parallels the mass production and controlled processes of routine semiconductor wafer manufacturing. The new package is based on using silicon slabs cut from wafers made of low-grade and thus low cost silicon, which can be obtained, for instance, from reclaimed, unrefined, and undoped silicon. While processed in wafer form, a slab obtains a depression suitable for assembling a single-crystal device chip, and can acts as a carrier as well as the final package.

The new package concept eliminates leadframes, bonding wires, clips, solder balls, and plastic, ceramic, and metallic housings. Instead, the fabrication processes use tried-and-true front-end techniques such as etching semiconductors, metals, and insulators, depositing layers of metals, insulators, and passivation, growing insulating layers, and patterning by photoresist technologies.

The resulting devices no longer suffer from mismatched coefficients of thermal expansion, but instead allow the minimization of thermo-mechanical stresses. In addition, parasitic resistances and inductances are reduces since wire bonds and clips are eliminated. Thermal conductivity and thus electrical performance of the new devices is enhanced by attaching the chips of the finished devices directly onto circuit boards.

DETAILED DESCRIPTION OF THE PREFERRED EMBODIMENTS

Figure 1:
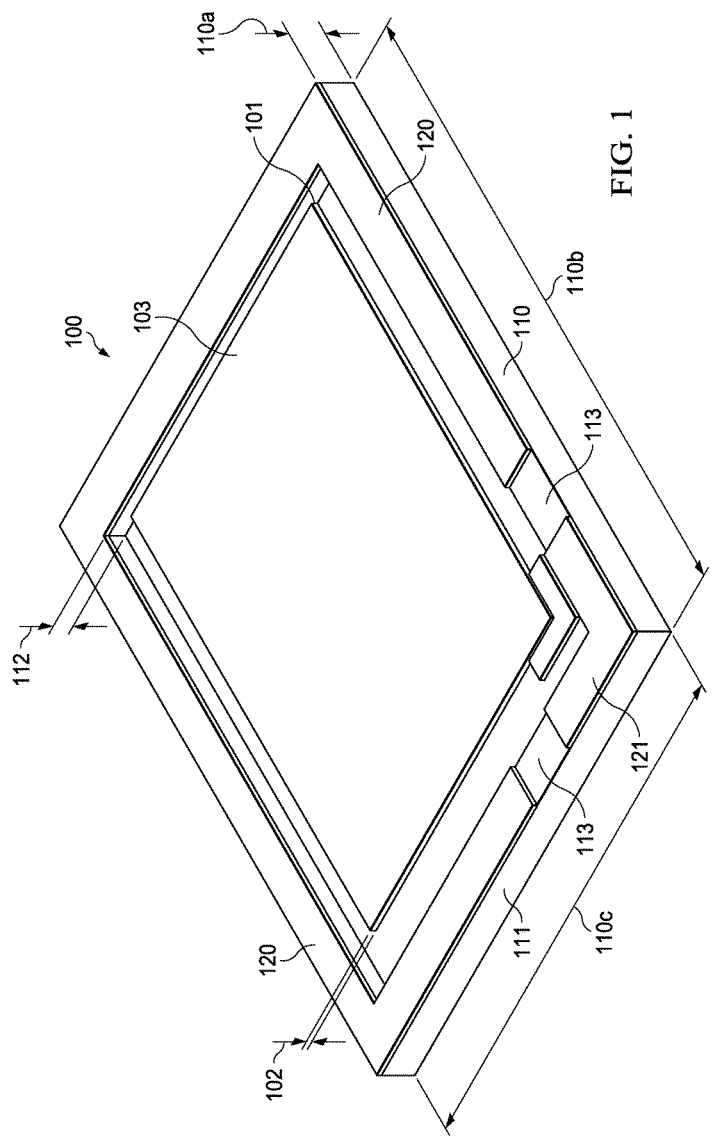
FIG. 1 illustrates a perspective view of an embodiment of the invention, a silicon MOS field effect transistor (FET) flip-attached to and embedded into a silicon package.

FIG. 1 illustrates device 100 as an exemplary embodiment of the invention, a semiconductor chip 101 inserted into, and attached to, a slab of low-grade silicon as package 110. The chip includes a transistor with terminals distributed on the first and the opposite second chip side. In the exemplary embodiment of FIG. 1, semiconductor chip 101 is made of single-crystalline silicon and has a thickness 102 of, for instance, 50 µm; the transistor is a MOS field effect transistor with the source and gate terminals on the first side attached to the package and the drain terminal 103 on the opposite second side and facing away from the package. In other embodiments, the semiconductor chip may be made of, for example, silicon-germanium, gallium arsenide, gallium nitride, or other III-V and II-IV compounds used as semiconductor device materials. In yet other FET embodiments, drain and gate terminals may be on the first side and attached to the package and the source terminals may be facing away from the package. In still other embodiments, the transistor may be a bipolar transistor having emitter and base terminals on the first side and attached to the package, and the collector contact on the opposite second side facing away from the package; or the bipolar transistor may have the collector and base contact attached to the package with the emitter terminal facing away from the package.

In the example of FIG. 1, slab 110 is made of low-grade silicon, wherein the low-grade silicon (l-g-Si) is selected from a group including, but not limited to, reclaimed silicon, unrefined silicon, undoped silicon, polycrystalline silicon, intrinsic polycrystalline silicon, lowly doped n-type polycrystalline silicon, and lowly doped p-type polycrystalline silicon. In the example of FIG. 1, slab 110 has a thickness 110a of about 300 µm, a length 110b of about 5.8 mm. and a width 110c of about 3.7 mm. The l-g-Si is exposed at the edges of the slab, while the slab side viewed in FIG. 1 is covered by an insulating layer. Portions of the insulating layer are exposed at locations 113, while other portions are covered by a metal layer, which is configured as terminals 120 (for instance, FET source) and 121 (for instance, FET gate) of device 100. The surface of the metal layer is herein called first surface; the first surface is in a first plane.

As FIG. 1 shows, slab 110 has a thickness 110a and is configured as an elevated ridge 111 framing a depression. The depression includes a recessed central area suitable to accommodate chip 101. The recessed central area has a second surface in a second plane, which is spaced from the first plane by a depression depth 112. Preferably, depth 112 is equal to the sum of the chip thickness 102 and the thickness of the adhesive material used to attach chip 101 to the recessed central area. In the example of FIG. 1, depth 112 may be about 64 µm. As shown in later figures, the central area is covered by a patterned metal layer configured as attachment pads for the transistor terminals.

As indicated in FIG. 1, chip 101 is attached with its terminals on the first chip side (not shown in FIG. 1) to the metallic pads of the central slab area. The attachment is performed, and the layer thickness of the adhesive material is selected, so that the terminals 103 of the second chip side are co-planar with the device terminals 120 and 121 on slab ridge 110. The depth between the ridge and the central slab area is bridged by a step of the l-g-Si material inclined at an angle less than vertical. Consequently, conductive connections such as metal layers can be formed across the steps, connecting the attachment pads with the device terminals; as stated later, it is preferred to cover the connections across the steps with a passivation layer.

While the exemplary device of FIG. 1 has the ridge surrounding the central area as a rectangular frame, other embodiments may employ ridge configurations, which include a single linear ridge, two ridges parallel to each other at opposite sides of the central area, or three ridges interconnected by right angles.

With chip 101 inserted in the depression of slab 110, slab 110 can act as the package of transistor device 100. When chip 101 is made of silicon, there is practically no longer any difference of the coefficients of thermal expansion between chip and package, and thermo-mechanical stresses are in first order eliminated. Consequently, the risk of material-related delamination between chip and package is diminished and the device reliability greatly enhanced.

Figure 2:
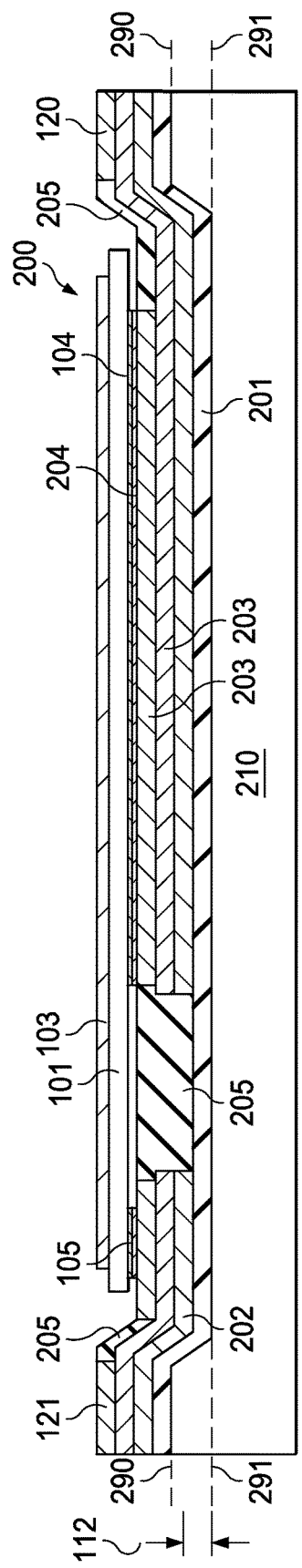
FIG. 2 shows a cross section of the assembled device of FIG. 1 for undoped or weakly doped l-g-Si (low grade silicon) slabs.
Figure 3:
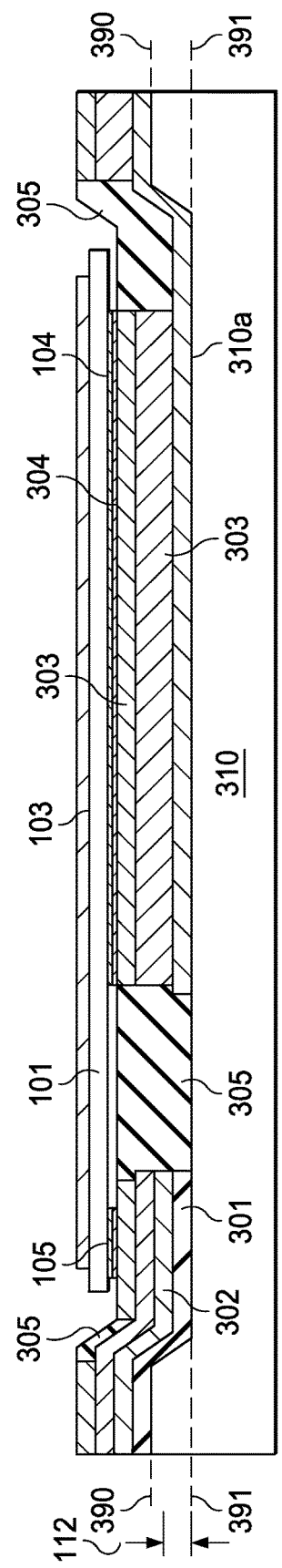
FIG. 3 depicts a cross section of the assembled device of FIG. 1 for heavily doped l-g-Si (low grade silicon) slabs.
Figure 4A:
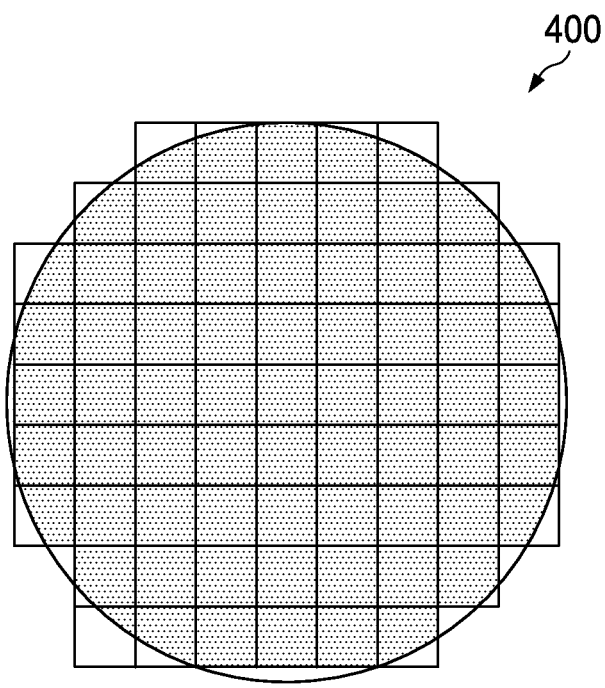
FIG. 4A illustrates the top view of a l-g-Si wafer with a plurality of slabs.
Figure 4B:
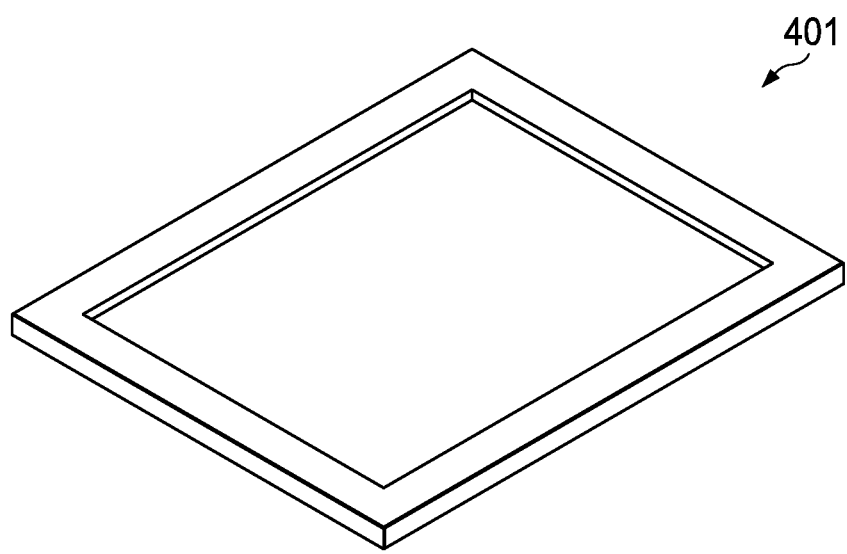
FIG. 4B shows a perspective view of an individual slab after the process of etching a depression into a slab side.

Another embodiment of the invention is a method of fabricating semiconductor slabs suitable as device packages, and a method of fabricating a packaged transistor device. FIGS. 4A and 4B depict certain processes, which are common for these methods, and FIG. 2 and FIG. 3 illustrate certain structural detail and processes of the methods. In FIG. 4A, the process flow of fabricating semiconductor slabs starts with providing a wafer 400 of low-grade silicon (l-g-Si), which includes a plurality of slab sites. The preferred wafer diameter is 300 mm, but smaller diameters may be used. In FIGS. 2 and 3, a discrete slab is designated 110 to conform to FIG. 1. Wafer 400 has a surface in a first plane 290. While it is preferred that the final wafer before dicing has a thickness of about 300 µm, it is practical to execute the preceding process steps using a thicker wafer and obtain the final thickness by back-grinding. The l-g-Si may be selected from a group including reclaimed silicon, unrefined silicon, undoped silicon, polycrystalline silicon, and intrinsic polycrystalline silicon. For devices with transistor terminals isolated from the slab (see FIG. 2), the l-g-Si material may also include undoped silicon, intrinsic polycrystalline silicon, lowly doped n-type polycrystalline silicon, and lowly doped p-type polycrystalline silicon. On the other hand, for devices with transistor terminals shorted to the slab (see FIG. 3), the l-g-Si material may also include low resistivity n-type polycrystalline silicon and low resistivity p-type polycrystalline silicon. The slab of undoped or weakly doped polycrystalline silicon is designated 210, the slab of heavily doped silicon is designated 310.

In the next process for both l-g-Si choices, a first insulating layer is formed on the surface of the wafer, the layer covering all slab sites. The preferred technique of forming an insulating surface layer is thermally oxidizing the silicon. Alternative techniques include depositing a layer of silicon dioxide, silicon nitride, silicon carbide, or a combination thereof, and depositing an insulating compound different from a silicon compound.

Then, the first insulating layer is removed from the central portion of each slab site to expose the underlying l-g-Si, while leaving un-removed the first insulating layer over the peripheral site portions to form a ridge framing each central portion.

In the next process, the exposed l-g-Si of the central area of each slab site is etched, for instance using KOH, to create a depression with a second l-g-Si surface having a flat central portion in a second plane 291 recessed from the first plane by a depth 112. For the discrete slab site 401 in FIG. 4B, and for the device depicted in FIG. 1, the depression has a rectangular configuration; for other devices, other configurations may be used. The depression, which is formed by the etching process, also creates a step of l-g-Si between the first plane 290 and the second plane 291; preferably, the step is inclined less than 90°, and more preferably, the step forms a gradual slope between the first and the second lg-Si surface so that an uninterrupted metal layer can be deposited.

In the process flow leading up to the packaged transistor device of FIG. 2, the flow starts by providing a wafer of undoped or weakly doped l-g-Si, which includes a plurality of slab sites 210. Each site is configured into ridges with a top in a first plane 290 and a depression framed by the ridges. The depression includes a recessed central area in a second plane 291 spaced from the first plane by a depth 112. A second insulating layer 201 is formed on the second silicon surface, which covers all slab sites. While other techniques are possible, preferably the second insulating layer is thermally grown so that the silicon dioxide of the second layer merges with the left-over silicon dioxide of the first layer.

Next, at least one layer 202 of metal is deposited onto the second insulating layer 201, covering all slab sites. Preferably, first a layer of a refractory metal such as titanium is selected, followed by a compound layer such as titanium nitride. Alternative choices include a layer of tungsten, or titanium-tungsten, or another refractory metal. The refractory metal adheres strongly to insulating layer 201. Then, a layer 203 of aluminum is deposited onto the refractory metal layer; layer 203 is preferably thicker than layer 202. For some applications, it is preferred to deposit a layer of nickel and a thin layer of gold (both layers designated 204 in FIG. 2) on top or the aluminum layer 203 in order to facilitate the attachment of transistor terminals.

Figure 5:
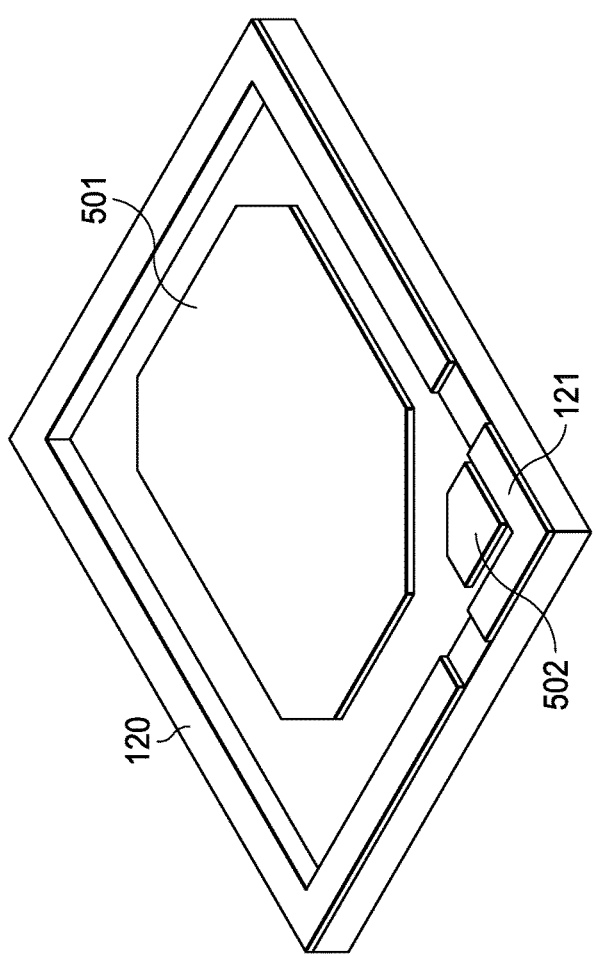
FIG. 5 depicts a perspective view of the metal patterns in the depression and on the ridges of a slab side.

Next, the metal layers 202 and 203 are patterned in the central site portion of each slab site. The result of the patterning is a plurality of pads matching the terminals of a transistor; in addition, the metal on the ridges is retained as terminals. FIG. 5 gives an overview of the patterned metal pads of a discrete slab; pad 501 is patterned for the source terminals of a field-effect transistor, pad 502 for the gate terminal; metal strip 120 is intended for the source terminal of the assembled device, and metal strip 121 for the gate terminal. After the patterning, a layer 205 of passivation material such as silicon nitride is deposited onto the patterned metal layer, covering all slab sites. Passivation layer 205 is then removed, at each slab site, from the terminals on the ridges and from the pads in the central portion in order to expose the underlying metal; on the other hand, the passivation material over the slopes and between the pads is left un-removed.

In the next process step, a plurality of chips 101 is provided, which include transistors with terminals on the first and the second chip side. As an example, the chips may have a FET with a source terminal 104 and a gate terminal 105 on the first chip side and a drain terminal 103 on the opposite second chip side. The terminals of the first chip sides are then attached to respective pads in the central portion of each slab site; the attachment is performed so that the terminals 103 of the opposite second chip side are co-planar with the metal layer of the ridges framing each central portion. It is preferred that for the attaching process of the chip to the slab, an adhesive conductive polymeric compound, such as a B-stage epoxy or polyimide, is used. Alternatively, a solder compound or a z-axis conductor may be employed. After the attachment, the metal layers of the ridges have morphed into device terminal 120 (source terminal) and device terminal 121 (gate terminal), and each slab 210 has morphed into the package of a transistor device 200.

Figure 6:
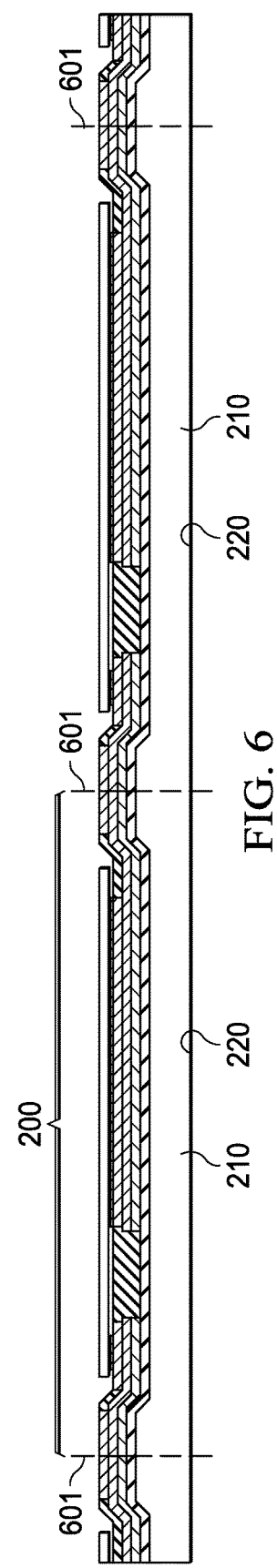
FIG. 6 shows a cross section of a l-g-Si wafer with a plurality of assembled devices before singulating discrete devices by a sawing process.

FIG. 6 illustrates a portion of a l-g-Si wafer completed after the attachment of transistor chips and eventual back-grinding. The above process flow continues by including the process of sawing the l-g-Si wafer along the lines 601 in order to singulate a plurality of slabs 210, each slab packaging a discrete transistor device. While saw blades may be used, it is preferred that the sawing process is performed by a laser technique.

The discrete transistor device 200 offers a blank silicon surface 220 suitable for attaching a heat sink to the device surface opposite the attached chip, greatly improving the heat dissipation and thermal performance of the device.

In the process flow leading up to the packaged transistor device of FIG. 3, an additional oxide etching process is inserted between the process of forming a second insulating layer 301 and the process of depositing at least one layer 302 of metal. The process flow starts by providing a wafer of heavily doped l-g-Si, such as low-resistivity n-type polycrystalline silicon of low-resistivity p-type polycrystalline silicon. The wafer includes a plurality of slab sites 310. Each site is configured into ridges with a top in a first plane 390 and a depression framed by the ridges. The depression includes a recessed central area in a second plane 391 spaced from the first plane by a depth 112. A second insulating layer 301 is formed on the second silicon surface, which covers all slab sites. While other techniques are possible, preferably the second insulating layer is thermally grown so that the silicon dioxide of the second layer merges with the left-over silicon dioxide of the first layer.

At each slab site, the second insulating layer 301 is removed, preferably by etching, from selected pads matching certain terminals of a transistor in order to expose the surface 310a of the underlying low-resistivity l-g-Si.

Next, at least one layer 302 of metal is deposited onto the remaining second insulating layer 301 and the exposed surface 310a of the doped l-g-Si slab, covering all slab sites. Preferably, first a layer of a refractory metal such as titanium is selected, followed by a compound layer such as titanium nitride. Alternative choices include a layer of tungsten, or titanium-tungsten, or another refractory metal. The refractory metal adheres strongly to insulating layer 301 as well as to doped silicon surface 310a. Then, a layer 303 of aluminum is deposited onto the refractory metal layer; layer 303 is preferably thicker than layer 302. For some applications, it is preferred to deposit a layer of nickel and a thin layer of gold (both layers designated 304 in FIG. 3) on top or the aluminum layer 303 in order to facilitate the attachment of transistor terminals to the metal layer.

Next, the metal layers 302 and 303 are patterned in the central site portion of each slab site. The result of the patterning is a plurality of pads matching the terminals of a transistor; in addition, the metal on the ridges is retained as terminals. After the patterning, a layer 305 of passivation material such as silicon nitride is deposited onto the patterned metal layer, covering all slab sites. Passivation layer 305 is then removed, at each slab site, from the terminals on the ridges and from the pads in the central portion in order to expose the underlying metal; on the other hand, the passivation material 305 over the slopes and between the pads is left un-removed.

In the next process step, a plurality of chips 101 is provided, which include transistors with terminals on the first and the second chip side. As an example, the chips may have a FET with a source terminal 104 and a gate terminal 105 on the first chip side and a drain terminal 103 on the opposite second chip side. The terminals of the first chip sides are then attached to respective pads in the central portion of each slab site; the attachment is performed so that the terminals 103 of the opposite second chip side are co-planar with the metal layer of the ridges framing each central portion. After the attachment, chip terminal 104 (in the example, the source terminal) is shorted to the slab, while chip terminal 105 (in the example, the gate terminal) is isolated from the slab.

Figure 7:
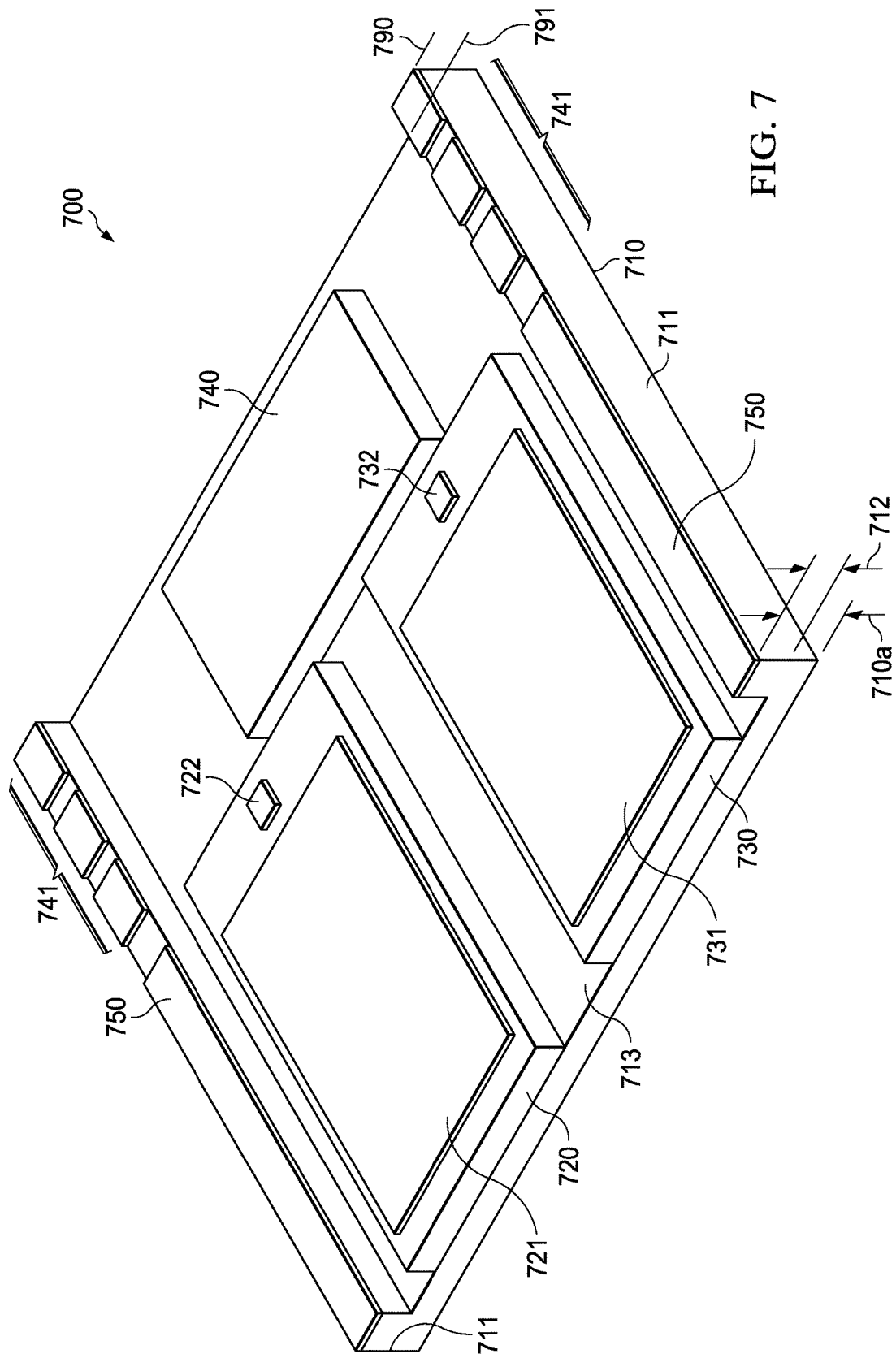
FIG. 7 illustrates a perspective view of a power converter embedded in and packaged by a l-g-Si slab according to the invention.

Another embodiment of the invention, a packaged electronic system generally designated 700, is illustrated in FIG. 7. Dependent on the transistors chosen, the system may be a power converter or a regulator. FIG. 7 depicts a power converter system with the semiconductor chips assembled side-by-side on a low-grade silicon (l-g-Si) slab 710; the semiconductor chips include a first set wherein the chips include a transistor having terminals distributed on the first and the opposite second chip side, and a second set wherein the chips include an integrated circuit having terminals on one chip side. In the example illustrated, the chips of the first set include chip 720 with a drain-down FET as the low-side chip, and chip 730 with a source-down FET as the high-side chip, and the chips of the second set include chip 740 with an integrated circuit, referred to as driver-and control chip. All chips have preferably the same thickness.

In the exemplary embodiment of a packaged electronic system depicted in FIG. 7, l-g-Si slab 710 has one side covered by an insulating layer 713 and configured as two parallel elevated ridges 711, which frame a depression of depth 712. Depth 712 may be in the range from about 0.05 to 0.1 mm, while the slab thickness 710a may be in the range from about 0.3 to 0.5 mm. The depression includes a recessed central area suitable to accommodate the chips of the first and the second set. The ridge has a first surface in a first plane 790 and the recessed central area having a second surface in a second plane 791 spaced from the first plane by depth 712 equal to the sum of the thickness of the chips and the attachment material.

The ridge with its insulating layer is covered by a metal layer patterned as system terminals. In the converter example of FIG. 7, system terminals include the switch node terminals 750 of the converter system, and the terminals 741 are the pin-outs of the driver-and-controller chip 740. The central area of the depression is covered by a metal layer (not shown in FIG. 7) configured as attachment pads for terminals of the transistors and integrated circuits.

In the attaching process of the chips, the drain of low-side FET 720 is attached, without flipping the chip, to the recessed central slab area so that the source terminal 721 and gate terminal 722 of the low side become co-planar with the system terminals 750 and 741 of the slab ridge. Terminal 721 is electrically connected to ground potential. In analogous fashion, the source of the high-side FET 730 is attached, without flipping the chip, to the recessed central slab area so that the drain terminal 731 and the gate terminal 732 of the high side become co-planar with the system terminals 750 and 741 of the slab ridge. Terminal 731 is electrically connected to input supply $V_{IN}$. For the attachment, chip 740 is flipped so that its terminals are facing slab 710 and can be attached to respective slab pads; the opposite and blank (terminal-free) side of chip 740 becomes co-planar with the ridge terminals of the slab. With co-planarity of chip and slab terminals established, slab 710 can serve as the package of the system.

The method for fabricating a packaged electronic system as shown in FIG. 7 starts with providing a wafer of low-grade silicon (l-g-Si). The wafer includes a plurality of slab sites, which are processed as a batch similar to the wafers processed in semiconductor front-end factories. Each site is configured into ridges, which frame a depression including a recessed central area. The system depicted has two ridges in parallel; other systems may three or four frames, usually arranged in rectangular geometry around the depression. The top of the ridges are in a first plane and the central area of the depression is in a second plane, which is spaced from the first plane by a depth. Preferably, the depth is equal to the sum of the thickness of the chips and the chip attachment layer. The depression and the ridges of each site are covered by metal layers.

In the next process step, the metal layers of each site are patterned into interconnected pads and terminals. The pads are in the central area and match the chip terminals of transistors and circuits; the terminals are on the ridges and are operable as terminals for the system. The techniques for depositing and patterning the metal layers are described above.

Next, semiconductor chips are provided. In the example of FIG. 7, a first set of chips includes transistors with terminals on the first and the opposite second chip side, and a second set of chips includes integrated circuits with all terminals on the first chip side and a blank second chip side. For other electronic systems, other types and other numbers of chips may be provided.

In the next process, the terminals of the first chip sides of both sets of chips are attached to respective pads in the central area of each slab site. It is preferred that a conductive adhesive polymeric compound is used for the attachment; alternatively, solder may be used. In either approach, the attachment is performed so that the opposite second chip sides are co-planar with the ridges, which frame each central area. The co-planarity facilitates an attachment of the system to an integrated circuit board or other mother board of end-users. By establishing the co-planarity, the slab serves as the package of the electronic system.

Figure 8:
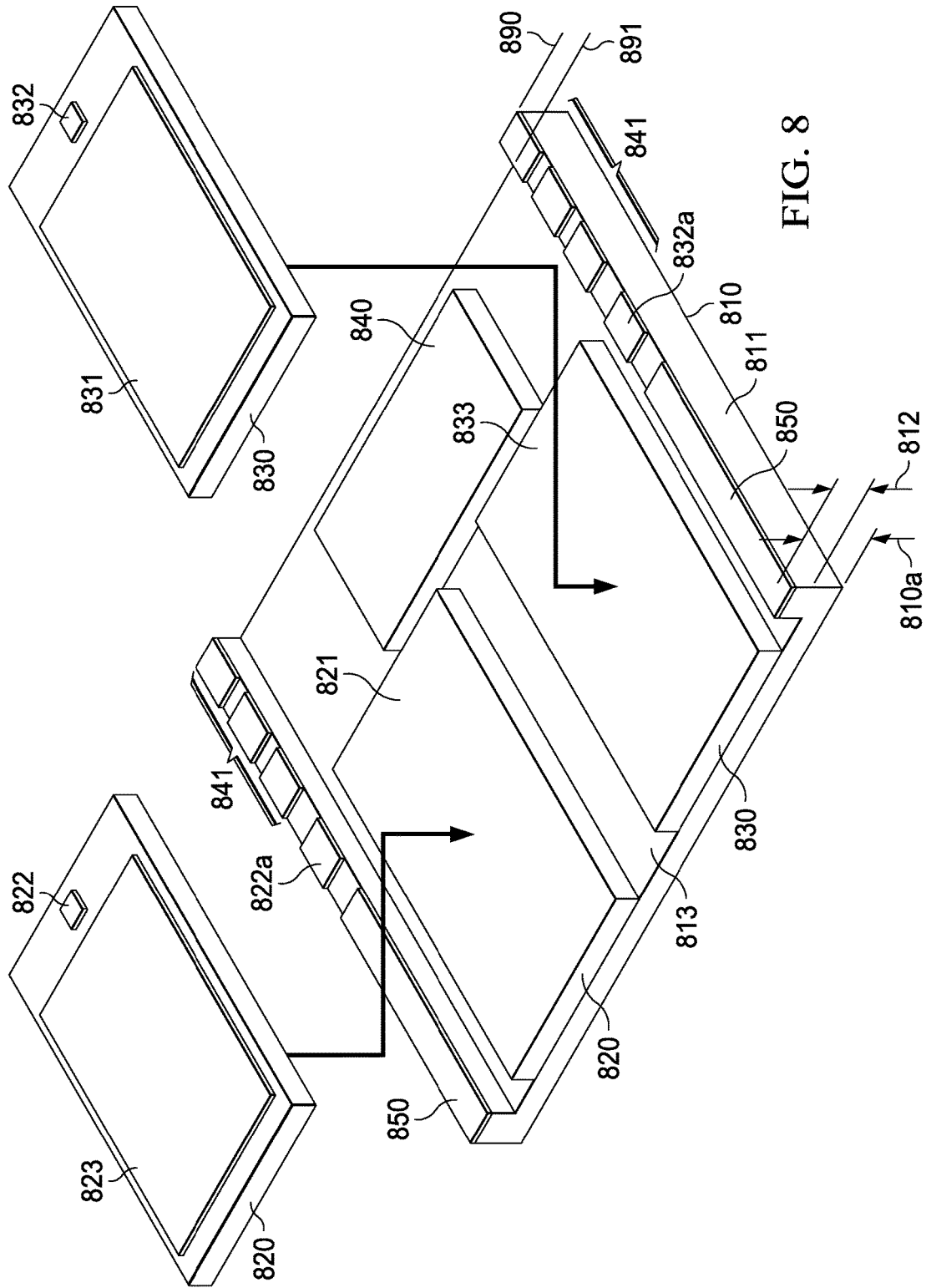
FIG. 8 illustrates a perspective view of another power converter embedded in and packaged by a l-g-Si slab according to the invention.

Another embodiment of the invention, a packaged power converter system 800 with different transistor chip arrangement from FIG. 7, is illustrated in FIG. 8. The transistor chips are assembled side-by-side on a low-grade silicon (l-g-Si) slab 810; the semiconductor chips include a first set wherein the chips include a transistor having terminals distributed on the first and the opposite second chip side, and a second set wherein the chips include an integrated circuit having terminals on one chip side. In the example illustrated in FIG. 8, the chips of the first set include chip 820 with a source-down FET as the low-side chip, and chip 830 with a drain-down FET as the high-side chip, and the chips of the second set include chip 840 with an integrated circuit, referred to as driver-and control chip. All chips have preferably the same thickness.

In the exemplary embodiment of a packaged electronic system depicted in FIG. 8, l-g-Si slab 810 has one side covered by an insulating layer 813 and configured as two parallel elevated ridges 811, which frame a depression of depth 812. Depth 812 may be in the range from about 0.05 to 0.1 mm, while the slab thickness 810a may be in the range from about 0.3 to 0.5 mm. The depression includes a recessed central area suitable to accommodate the chips of the first and the second set. The ridge has a first surface in a first plane 890 and the recessed central area having a second surface in a second plane 891 spaced from the first plane by depth 812 equal to the sum of the thickness of the chips and the attachment material.

The ridge with its insulating layer is covered by a metal layer patterned as system terminals. In the converter example of FIG. 8, system terminals include the switch node terminals 850 of the converter system, the terminals 841 as the pin-outs of the driver-and-controller chip 840, the gate terminal 822a of the low side transistor, and the terminal 832a of the high side transistor. The central area of the depression is covered by a metal layer (not shown in FIG. 8) configured as attachment pads for terminals of the transistors and integrated circuits.

In the attaching process of the chips, the low side FET 820 (a source down FET) is flipped so that the drain terminal 823 and the gate terminal 822 can be attached to the recessed central slab area, while the source terminal 721 becomes co-planar with the system terminals 750 and 741 of the slab ridge. Terminal 821 is electrically connected to ground potential. In analogous fashion, the high-side FET 730 (a drain down FET) is flipped so that the source terminal 831 and the gate terminal 832 can be attached to the recessed central slab area, while the drain terminal 833 becomes co-planar with the system terminals 750 and 741 of the slab ridge. Terminal 833 is electrically connected to input supply $V_{IN}$. For the attachment, chip 740 is flipped so that its terminals are facing slab 810 and can be attached to respective slab pads; the opposite and blank (terminal-free) side of chip 840 becomes co-planar with the ridge terminals of the slab. With co-planarity of chip and slab terminals established, slab 810 can serve as the package of the system.

The method for fabricating a packaged electronic system as shown in FIG. 8 starts with providing a wafer of low-grade silicon (l-g-Si). The wafer includes a plurality of slab sites, which are processed as a batch similar to the wafers processed in semiconductor front-end factories. Each site is configured into ridges, which frame a depression including a recessed central area. The system depicted has two ridges in parallel; other systems may three or four frames, usually arranged in rectangular geometry around the depression. The top of the ridges are in a first plane and the central area of the depression is in a second plane, which is spaced from the first plane by a depth. Preferably, the depth is equal to the sum of the thickness of the chips and the chip attachment layer. The depression and the ridges of each site are covered by metal layers.

In the next process step, the metal layers of each site are patterned into interconnected pads and terminals. The pads are in the central area and match the chip terminals of transistors and circuits; the terminals are on the ridges and are operable as terminals for the system. The techniques for depositing and patterning the metal layers are described above.

Next, semiconductor chips are provided. In the example of FIG. 8, a first set of chips includes transistors with terminals on the first and the opposite second chip side, and a second set of chips includes integrated circuits with all terminals on the first chip side and a blank second chip side. For other electronic systems, other types and other numbers of chips may be provided.

In the next process, the terminals of the first chip sides of both sets of chips are attached to respective pads in the central area of each slab site. It is preferred that a conductive adhesive polymeric compound is used for the attachment; alternatively, solder may be used. In either approach, the attachment is performed so that the opposite second chip sides are co-planar with the ridges, which frame each central area. The co-planarity facilitates an attachment of the system to an integrated circuit board or other mother board of end-users. By establishing the co-planarity, the slab serves as the package of the electronic system.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors, to bipolar transistors, insulated gate transistors, thyristors, and others.

As another example, the above considerations for structure and fabrication method of power converters apply to regulators, multi-output power converters, applications with sensing terminals, applications with Kelvin terminals, and others.

As another example, the high current capability of the packaged transistors and converter can be further extended, and the efficiency further enhanced, by using the blank backside of the l-g-Si, after attachment of the devices to a board, so that the back side can be connected to a heat sink, preferably. In this configuration, the device can dissipate its heat into the board as well as into the heat sink.

It is therefore intended that the appended claims encompass any such modifications or embodiments.

We claim:

1. A packaged transistor device comprising:
   a semiconductor chip having a thickness, the chip including a transistor with terminals distributed on a first side and an opposite second side of the semiconductor chip;
   a slab of silicon including a recessed central area suitable to accommodate the semiconductor chip and at least one ridge bordering the recessed central area the ridge having a first surface in a first plane and the recessed central area having a second surface in a second plane spaced from the first plane by a depth at least equal to the chip thickness, the at least one ridge having a metal layer configured as terminals of the transistor device and the recessed central area having pads; and the terminals of the first side attached to the pads so that the terminals of the opposite second side are co-planar with the device terminals wherein the slab serves as a package of the transistor device, wherein the terminals of the opposite second side are exposed from the package.

2. The device of claim 1 wherein the silicon is a low-grade silicon (l-g-Si) and is selected from a group consisting of reclaimed silicon, unrefined silicon, undoped silicon, polycrystalline silicon, intrinsic polycrystalline silicon, lowly doped n-type polycrystalline silicon, and lowly doped p-type polycrystalline silicon.

3. The device of claim 1 wherein the silicon is a l-g-Si and is selected from a group including low resistivity n-type polycrystalline silicon and low resistivity p-type polycrystalline silicon.

4. The device of claim 1 wherein the transistor is a MOS field-effect transistor (FET) with the terminal on the first side being a drain terminal and the terminal on the opposite second side being a source terminal.

5. The device of claim 1 wherein the transistor is a bipolar transistor with the terminal on the first side being an emitter terminal and terminal on the opposite second side being a collector terminal.

6. The device of claim 1 wherein the chip is made of a single-crystalline material selected from a group consisting of silicon, silicon germanium, gallium nitride, gallium arsenide, and other III-V and II-VI compounds.

7. The device of claim 1 wherein the depth between the first plane and the second plane is bridged by a step of the l-g-Si material inclined at an angle less than vertical.

8. The device of claim 7 wherein the pads are conductively connected to the device terminals across the step, the connection being covered with a passivation layer.

9. The device of claim 1 wherein the at least one ridge is selected from a group of configurations consisting of a single ridge, two ridges parallel to each other, three ridges, and four ridges arranged as a rectangle.

* * * * *